(12) United States Patent
Wu

(10) Patent No.: US 8,700,188 B2
(45) Date of Patent: Apr. 15, 2014

(54) SERVER AND HEAT DISSIPATION METHOD

(75) Inventor: Kang Wu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 296 days.

(21) Appl. No.: 13/283,594

(22) Filed: Oct. 28, 2011

(65) Prior Publication Data

US 2013/0079947 A1  Mar. 28, 2013

(30) Foreign Application Priority Data

Sep. 27, 2011 (CN) .......................... 2011 1 0296477

(51) Int. Cl.
- *G05B 11/01* (2006.01)
- *G05D 23/00* (2006.01)
- *G06F 1/20* (2006.01)
- *H05K 5/00* (2006.01)
- *H05K 7/20* (2006.01)

(52) U.S. Cl.
USPC ......... 700/25; 700/300; 361/679.49; 361/695

(58) Field of Classification Search
USPC ........... 700/11, 22, 25, 300; 361/600, 679.01, 361/679.02, 679.31, 679.46, 679.48, 361/679.49, 679.51, 688–690, 694, 695, 361/697
See application file for complete search history.

(56) References Cited

U.S. PATENT DOCUMENTS

| | | | | |
|---|---|---|---|---|
| 6,927,978 | B2 * | 8/2005 | Arai et al. | 361/695 |
| 7,325,590 | B2 * | 2/2008 | Kim et al. | 165/104.33 |
| 7,751,189 | B2 * | 7/2010 | Ahuja et al. | 361/697 |
| 7,948,196 | B2 * | 5/2011 | Begun et al. | 318/471 |
| 8,593,806 | B2 * | 11/2013 | Huang | 361/679.49 |
| 2009/0154092 | A1 * | 6/2009 | Chen | 361/679.51 |
| 2012/0044634 | A1 * | 2/2012 | Huang et al. | 361/679.49 |
| 2012/0124590 | A1 * | 5/2012 | Balakrishnan et al. | 718/103 |
| 2012/0147546 | A1 * | 6/2012 | Chen et al. | 361/679.31 |
| 2012/0218707 | A1 * | 8/2012 | Chan | 361/679.48 |

\* cited by examiner

*Primary Examiner* — Crystal J Barnes-Bullock
(74) *Attorney, Agent, or Firm* — Novak Druce Connolly Bove + Quigg LLP

(57) ABSTRACT

A server and a heat dissipation method adapted for the server are provided. The method includes: sensing temperatures of two temperature sensors. Recognizing the two temperature sensors, determining a temperature difference between the two temperature sensors and obtaining a comparison result. Selecting one stored table according to the comparison result and acquiring fan running data recorded in the table. In addition, controlling the at least one fan to rotate according to the acquired fan running data. When a motherboard of the server is in one installation direction, the server selects corresponding fan running data and controls the at least one fan to rotate according to the two temperatures of the two temperature sensors installed at the two opposite ends of the motherboard. Therefore, the server can get a good heat dissipation effect in two installation directions of the motherboard.

9 Claims, 5 Drawing Sheets

SERVER AND HEAT DISSIPATION METHOD

BACKGROUND

1. Technical Field

The disclosure relates to servers and, more particularly, to a server and a heat dissipation method adapted for the server.

2. Description of Related Art

When a motherboard in a server is installed in one direction and a user wants to connect peripheral devices to the ports, he/she may need to move to the back end, which is very inconvenient. Therefore, the user may rotate a motherboard of the server so the connection ports are installed at the front, however, the heat dissipation application cannot satisfy the heat dissipation of the motherboard due to a change of the position.

Therefore, what is needed is a server to overcome the described shortcoming.

DETAILED DESCRIPTION

Figure 1:
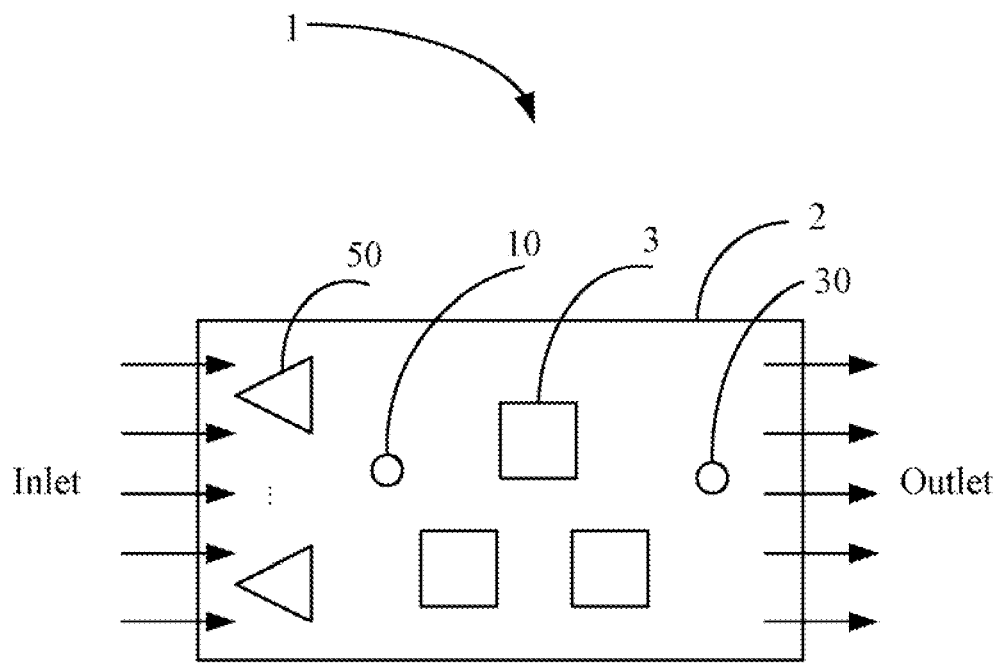
FIG. 1 is a schematic view of distributing components on a motherboard of a server in accordance with an exemplary embodiment.
Figure 2:
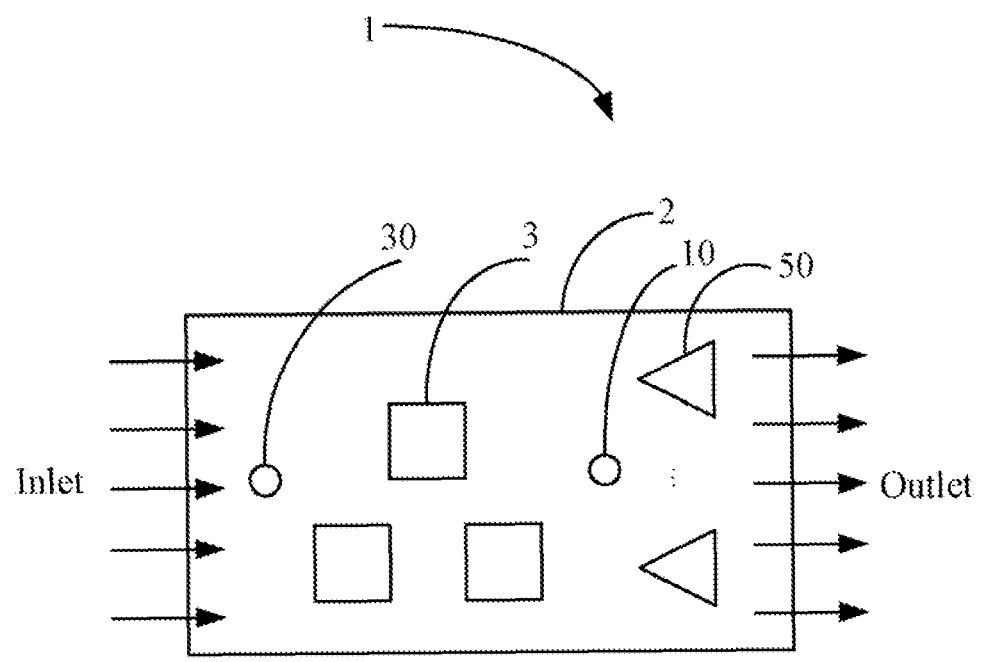
FIG. 2 is similar with FIG. 1, but the motherboard is rotated 180 degrees.
Figure 3:
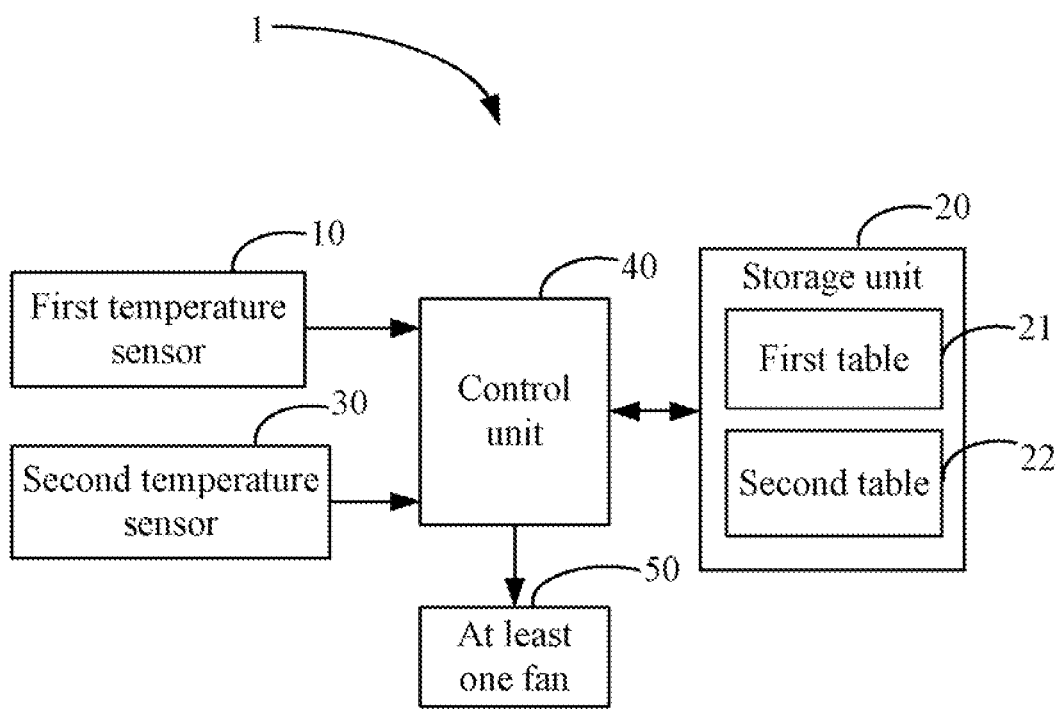
FIG. 3 is a block diagram of the server of FIG. 1.

Referring to FIGS. 1-3, a server 1 includes a rack box (not shown) accommodating a motherboard 2 of the server 1 and a plurality of components 3 are distributed on the motherboard 2, such as fans 50, for example. The server 1 defines an inlet and an outlet. The server 1 further includes a first temperature sensor 10, a second temperature sensor 30, a storage unit 20, a control unit 40, and the at least one fan 50. The motherboard 2 is installed in two installation directions and between the inlet and the outlet in the box in a horizontal state as shown in FIGS. 1 and 2. The two installation directions are orientated in opposite directions. For example, the installation direction in FIG. 2 is obtained by rotating the motherboard 2 in the installation direction in FIG. 1 relative to 180 degrees. A user may select one installation direction of the motherboard 2 according to his/her needs.

As shown in FIG. 1, the first temperature sensor 10 is installed at one end of the motherboard 2 and adjacent to the at least one fan 50, the second temperature sensor 30 is installed at the opposite end of the motherboard 2, and other components 3 are distributed between the two temperature sensors 10 and 20. The first temperature sensor 10 is closer to the inlet than the second temperature sensor 30. The first temperature sensor 10 senses the temperature of the end of the motherboard 2 and the second temperature sensor 30 senses the temperature of the opposite end of the motherboard 2.

If airflow is provided from the end to the opposite end of the motherboard 2 (i.e., along the direction of an arrow shown in FIGS. 1 and 2). In FIG. 1, the at least one fan 50 draws in cool air from the inlet of the server 1 and causes the cool air to move to the components 3 to dissipate heat, therefore, the temperature sensed by the first temperature sensor 10 is less than that sensed by the second temperature sensor 30.

In FIG. 2, the motherboard 2 is rotated 180 degrees relative to the direction in the box in FIG. 1. The second temperature sensor 30 is closer to the inlet than the first temperature sensor 10. The at least one fan 50 is also rotated 180 degrees relative to the motherboard 2 thereon to draw in cool air from the inlet. As a result, the first temperature sensor 10 senses the temperature of hot air from the outlet and the second temperature sensor 30 senses the temperature of cool air from the inlet, therefore, the temperature sensed by the first temperature sensor 10 is greater than that sensed by the second temperature sensor 30.

The storage unit 20 stores at least two tables. In the embodiment, the storage unit 20 stores a first table 21 and a second table 22 respectively associated with the two installation directions. For example, the first table 21 corresponds to the installation direction shown in FIG. 1, and the second table 22 corresponds to the installation direction shown in FIG. 2. Each table records a fan running data and a comparison of the two temperatures 10, 30. The fan running data includes, but is not limited to, a rotation speed and air volume of the at least one fan 50. The first fan running data in the first table 21 is different from the second fan running data in the second table 22.

Figure 4:
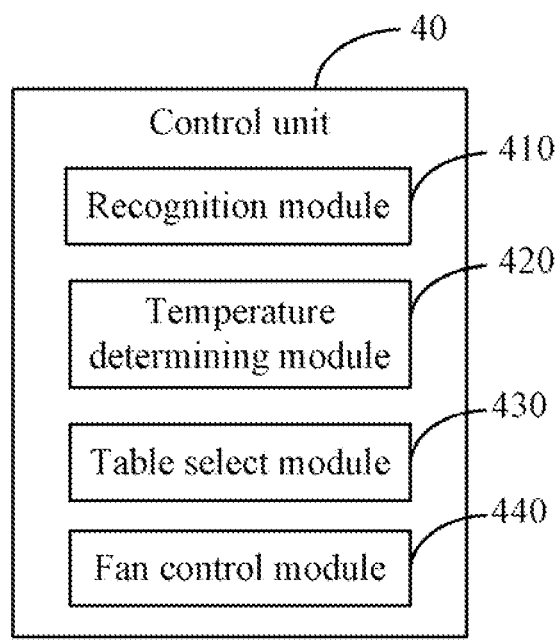
FIG. 4 is a block diagram of a control unit of the server of FIG. 3.

As shown in FIG. 4, the control unit 40 includes a recognition module 410, a temperature determining module 420, a table select module 430, and a fan control module 440. The recognition module 410 recognizes the first and the second temperature sensors 10, 30. In the embodiment, the recognition module 410 recognizes the first and the second temperature sensors 10, 30 according to the positions of the two temperature sensors 10, 30. For example, the recognition module 410 recognizes the first and the second temperature sensors 10, 30 according to the coordinates of the two temperature sensors 10, 30.

The temperature determining module 420 determines a temperature difference between the first and the second temperature sensors 10, 30 and obtains a comparison result. In the embodiment, the temperature determining module 420 determines whether the temperature sensed by the first temperature sensor 10 is greater than that sensed by the second temperature sensor 30. The table select module 430 selects one table according to the comparison result from the storage unit 20 and acquires the fan running data recorded in the table, and the fan control module 440 controls the at least one fan 50 to rotate according to the acquired fan running data.

Figure 5:
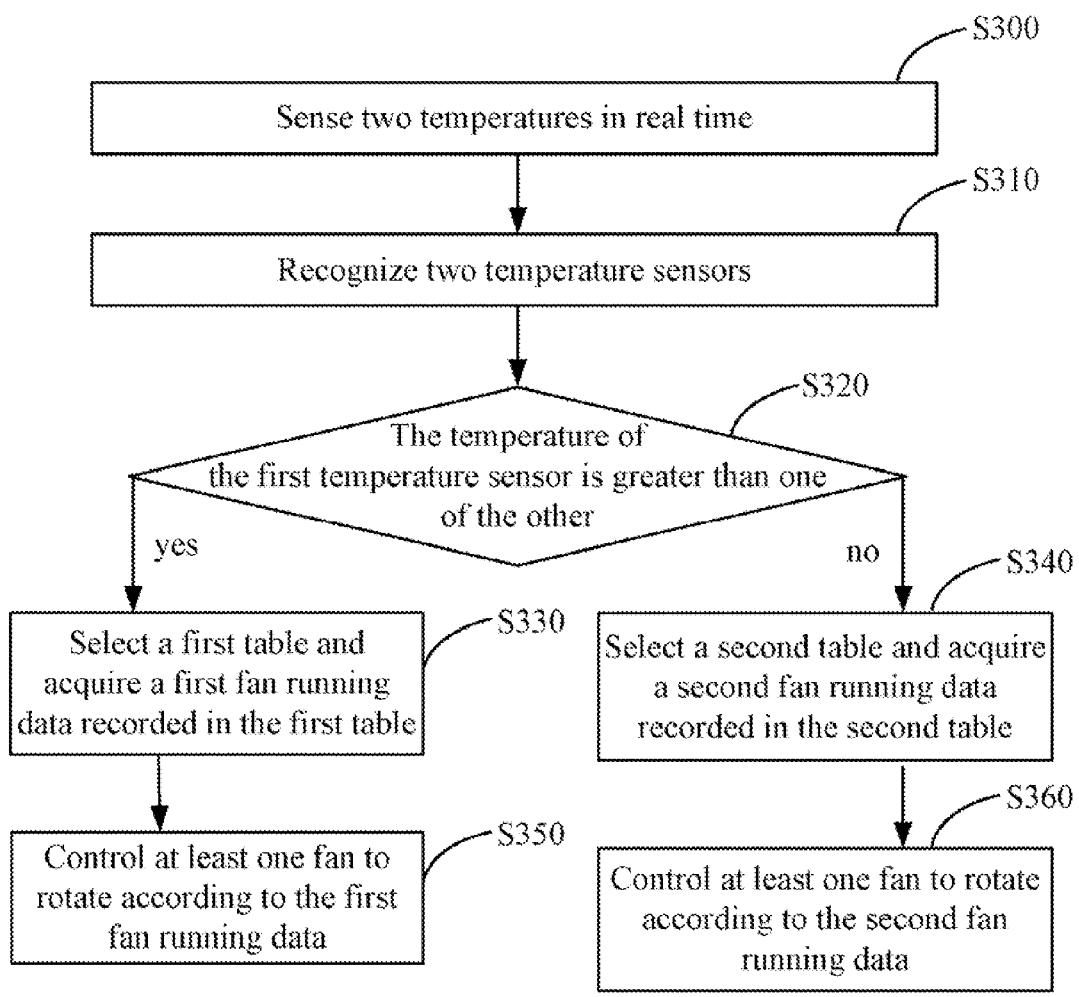
FIG. 5 is a flowchart of heat dissipation method for the server of FIG. 3.

FIG. 5 is a flowchart of heat dissipation method for the server of FIG. 3. In step S300, the first, and the second temperature sensors 10, 30 sense the temperatures in real time. In step S310, the recognition module 410 recognizes the first and the second temperature sensors 10, 30. In step S320, the temperature determining module 420 determines the temperature difference between the first and the second temperature sensors 10, 30 and obtains a comparison result, that is, the temperature determining module 420 determines whether the temperature sensed by the first temperature sensor 10 is greater than that sensed by the second temperature sensor 30.

When the temperature determining module 420 determines that the temperature sensed by the first temperature sensor 10 is greater than that sensed by the second temperature sensor 30, in step S330, the table select module 430 selects the first table 21 from the storage unit 20 and acquires the first fan running data recorded in the first table 21. In step S350, the fan control module 440 controls the at least one fan 50 to rotate according to the first fan running data. When the temperature determining module 420 determines that the temperature sensed by the second temperature sensor 30 is greater than that sensed by the first temperature sensor 10, in step S340, the table select module 430 selects the second table 22 from the storage unit 20 and acquires the second fan running data recorded in the second table 22. In step S360, the fan control module 440 controls the at least one fan 50 to rotate according to the second fan running data.

When the motherboard 2 is installed at one direction in the box, the server 1 selects corresponding fan running data and controls the at least one fan 50 to rotate according to the two temperatures sensed by the first and the second temperature sensors 10, 30 installed at the two opposite ends of the motherboard 2. Therefore, the server 1 can get a good heat dissipation effect in two directions of the motherboard 2.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A server defining an inlet and an outlet, the server comprising:
    a motherboard installable in two installation directions and between the inlet and the outlet;
    at least one fan;
    a first temperature sensor, installed at one end of the motherboard and adjacent to the at least one fan, to sense a temperature of the end of the motherboard;
    a second temperature sensor, installed at an opposite end of the motherboard, to sense a temperature of the opposite end of the motherboard;
    a storage unit to store a first table and a second table respectively associated with the two installation directions, each table recording a fan running data and a comparison of the two temperatures, wherein in one of the two installation directions, the first temperature sensor is closer to the inlet than the second temperature sensor, and in the other one of the two installation directions, the second temperature sensor is closer to the inlet than the first temperature sensor; and
    a control unit comprising:
        a recognition module to recognize the first and the second temperature sensors;
        a temperature determining module to determine a temperature difference between the first and the second temperature sensors and obtain a comparison result;
        a table select module to select one table according to the comparison result from the storage unit and acquire the fan running data recorded in the table; and
        a fan control module to control the at least one fan to rotate according to the acquired fan running data.

2. The server as recited in claim 1, wherein the recognition module is configured to recognize the first and the second temperature sensors according to the positions of the two temperature sensors.

3. The server as recited in claim 1, wherein when the temperature determining module determines that the temperature sensed by the first temperature sensor is greater than that sensed by the second temperature sensor, the table select module selects the first table from the storage unit and acquires the first fan running data recorded in the first table, and when the temperature determining module determines that the temperature sensed by the second temperature sensor is greater than that sensed by the first temperature sensor, the table select module selects the second table from the storage unit and acquires the second fan running data recorded in the second table.

4. The server as recited in claim 1, wherein the two installation directions are orientated in opposite directions.

5. A heat dissipation method for a server, wherein the server defines an inlet and an outlet, and comprises a motherboard installable in two installation directions and between the inlet and the outlet, at least one fan, and a first and a second temperature sensors respectively installed at two opposite ends of the motherboard, the server stores a first table and a second table respectively associated with the two installation directions, each table records a fan running data and a comparison of the two temperatures, in one of the two installation directions, the first temperature sensor is closer to the inlet than the second temperature sensor, and in the other one of the two installation directions, the second temperature sensor is closer to the inlet than the first temperature sensor, the method comprising:
    sensing the temperatures of the first and the second temperature sensors;
    recognizing the first and the second temperature sensors;
    determining a temperature difference between the first and the second temperature sensors and obtaining a comparison result;
    selecting one stored table according to the comparison result and acquiring the fan running data recorded in the table; and
    controlling the at least one fan to rotate according to the acquired fan running data.

6. The heat dissipation method as recited in claim 5, wherein the step "recognizing the first and the second temperature sensors" comprises recognizing the first and the second temperature sensors according to the positions of the two sensors.

7. The heat dissipation method as recited in claim 5, wherein the step "determining the temperature different between the first and the second temperature sensors" comprises determining whether the temperature of the first temperature sensor is greater or less than one of the second temperature sensor.

8. The heat dissipation method as recited in claim 7, further comprising:
    when the temperature of the first temperature sensor is greater than one of the second temperature sensor, selecting the first stored table and acquiring the first fan running data recorded in the first table; and
    when the temperature of the second temperature sensor is greater than one of the first temperature sensor, selecting the second stored table and acquiring the second fan running data recorded in the second stored table.

9. The heat dissipation method as recited in claim 5, wherein the two installation directions are orientated in opposite directions.

* * * * *